United States Patent
Alper et al.

(10) Patent No.: US 10,818,785 B2
(45) Date of Patent: Oct. 27, 2020

(54) SENSING DEVICE FOR SENSING MINOR CHARGE VARIATIONS

(71) Applicant: ECOLE POLYTECHNIQUE FEDERALE DE LAUSANNE (EPFL), Lausanne (CH)

(72) Inventors: Cem Alper, Lausanne (CH); Mihai Adrian Ionescu, Ecublens VD (CH); Teodor Rosca, Renens (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 16/200,718

(22) Filed: Nov. 27, 2018

(65) Prior Publication Data
US 2019/0172937 A1   Jun. 6, 2019

(30) Foreign Application Priority Data
Dec. 4, 2017   (EP) .................................. 17205101

(51) Int. Cl.
| H01L 29/768 | (2006.01) |
|---|---|
| H01L 27/092 | (2006.01) |
| H01L 21/8234 | (2006.01) |
| H01L 21/02 | (2006.01) |
| H01L 21/8238 | (2006.01) |
| H01L 29/66 | (2006.01) |
| H01L 29/739 | (2006.01) |
| H01L 29/165 | (2006.01) |

(52) U.S. Cl.
CPC ........ *H01L 29/768* (2013.01); *H01L 21/0226* (2013.01); *H01L 21/02241* (2013.01); *H01L 21/8238* (2013.01); *H01L 21/823406* (2013.01); *H01L 27/0922* (2013.01); *H01L 29/66356* (2013.01); *H01L 29/7391* (2013.01); *H01L 29/165* (2013.01)

(58) Field of Classification Search
CPC . H01L 29/768; H01L 29/165; H01L 27/0922; H01L 29/7391; H01L 21/02241; H01L 21/0226
See application file for complete search history.

(56) References Cited

U.S. PATENT DOCUMENTS

| 4,924,278 A * | 5/1990 | Logie ................. G11C 16/0433 257/318 |
|---|---|---|
| 5,023,835 A * | 6/1991 | Akimoto .................. G11C 8/06 326/105 |
| 5,359,573 A * | 10/1994 | Wang ................. G11C 16/0433 257/250 |

(Continued)

OTHER PUBLICATIONS

Adrian M. Ionescu et al., "Tunnel field-effect transistors as energy-efficient electronic switches," Nature, vol. 479, No. 7373, pp. 329-337, Nov. 17, 2011.

(Continued)

*Primary Examiner* — Nathan W Ha
(74) *Attorney, Agent, or Firm* — Blueshift IP, LLC; Robert Plotkin

(57) ABSTRACT

A charge sensing device for sensing charge variations in a charge storage area includes: a TFET having at least one sense gate; and a capacitive coupling for coupling the charge storage area with the sense gate.

9 Claims, 6 Drawing Sheets

(56) References Cited

U.S. PATENT DOCUMENTS

| | | | | |
|---|---|---|---|---|
| 5,742,542 | A * | 4/1998 | Lin | G11C 16/0433 257/318 |
| 5,761,116 | A * | 6/1998 | Li | G11C 16/0441 257/319 |
| 5,999,449 | A * | 12/1999 | Mehta | G11C 16/0441 365/185.05 |
| 6,064,595 | A * | 5/2000 | Logie | G11C 16/0441 257/E29.307 |
| 6,172,392 | B1 * | 1/2001 | Schmidt | H01L 27/115 257/315 |
| 6,214,666 | B1 * | 4/2001 | Mehta | G11C 16/0441 257/E21.422 |
| 6,274,898 | B1 * | 8/2001 | Mehta | G11C 16/0441 257/295 |
| 6,282,123 | B1 * | 8/2001 | Mehta | G11C 16/0441 257/316 |
| 6,294,809 | B1 * | 9/2001 | Logie | H01L 27/115 257/320 |
| 6,294,811 | B1 * | 9/2001 | Fong | G11C 16/0433 257/314 |
| 6,326,663 | B1 * | 12/2001 | Li | H01L 27/115 257/318 |
| 6,369,421 | B1 * | 4/2002 | Xiang | G11C 16/0441 257/321 |
| 7,180,107 | B2 * | 2/2007 | Appenzeller | B82Y 10/00 257/288 |
| 9,659,665 | B1 * | 5/2017 | Kim | G11C 16/0483 |
| 10,104,322 | B2 * | 10/2018 | Mandelli | H01L 27/14612 |
| 2003/0085727 | A1 * | 5/2003 | Gunther | G11C 29/50 257/48 |
| 2006/0038758 | A1 * | 2/2006 | Routley | G09G 3/3233 345/81 |
| 2006/0138209 | A1 * | 6/2006 | Schneider | G06K 7/10851 235/375 |
| 2006/0267071 | A1 * | 11/2006 | Carver | H01L 29/42324 257/315 |
| 2011/0025399 | A1 * | 2/2011 | Tobita | H03K 19/018521 327/333 |
| 2014/0176401 | A1 * | 6/2014 | Kim | G09G 3/3208 345/76 |
| 2015/0042308 | A1 * | 2/2015 | Li | G01R 19/0092 324/76.11 |
| 2016/0098961 | A1 * | 4/2016 | Han | G09G 3/3291 345/691 |
| 2016/0359483 | A1 * | 12/2016 | Mukhopadhyay | H03K 17/74 |
| 2017/0053590 | A1 * | 2/2017 | Song | G01R 19/1659 |
| 2017/0067849 | A1 * | 3/2017 | Cobianu | G01N 27/4141 |
| 2017/0099046 | A1 * | 4/2017 | Osanai | H03K 17/162 |
| 2017/0345358 | A1 * | 11/2017 | Xu | G09G 3/3225 |
| 2018/0027193 | A1 * | 1/2018 | Bock | H01L 27/14609 348/241 |

OTHER PUBLICATIONS

Rakhi Narang et al., "A Dielectric-Modulated Tunnel-FET-Based Biosensor for Label-Free Detection: Analytical Modeling Study and Sensitivity Analysis," IEEE Transactions on Electron Devices, vol. 59, No. 10, pp. 2809-2817, Oct. 2012.

R. Maurand et al., "A CMOS silicon spin qubit" Nature Communications, Nov. 24, 2014, 6 pages.

Lin-Jun Wang et al., "A graphene quantum dot with single electron transistor as an integrated charge sensor," Applied Physics Letters, 97, 262113 (2010); doi: 10.1063/1.3533021, publication year 2010, 4 pages.

D. Berman et al., "Observation of Quantum Fluctuations of Charge on a Quantum Dot," Physical Review Letters, vol. 82, No. 1, Jan. 4, 1999, pp. 161-164.

Anran Gao et al., "Robust ultrasensitive tunneling-FET biosensor for point-of-care diagnostics," Scientific Reports, vol. 6, No. Nov. 2015, published Mar. 2, 2016, 9 pages.

M. Veldhorst et al., "An addressable quantum dot qubit with fault-tolerant control-fidelity," Nature Nanotechnology, Oct. 12, 2014, pp. 981-985.

S. Mahapatra et al., "Hybrid CMOS single-electrontransistor device and circuit design", Jan. 9, 2006, Artech House, Inc,. book publication 2016, 237 pages.

* cited by examiner

SENSING DEVICE FOR SENSING MINOR CHARGE VARIATIONS

TECHNICAL FIELD

The present invention relates to semiconductor sensing devices for measuring changes in charge with a high sensitivity, particularly for reading out qubits from a quantum dot.

TECHNICAL BACKGROUND

Charge sensing devices for integration in CMOS are widely known in the art. However, as conventional CMOS devices provide physical constraints, the sensitivity of CMOS sensing devices is limited and strongly dependent on temperature.

Substantially, MOSFET transistors are governed by the thermionic emission of carriers which imposes a physical limit on the subthreshold swing which is about 60 mV/decade at room temperature (T=300K or 27° C.). The subthreshold swing limits the transconductance value which is an important quantity for analogue applications and particularly affects the achievable gain.

To overcome this physical barrier, tunnel FETs (TFET) have been recently proposed for switching applications especially for low-supply voltage scenarios as e.g. disclosed in A. M. Ionescu and H. Riel, "Tunnel field-effect transistors as energy-efficient electronic switches.," Nature, vol. 479, no. 7373, pp. 329-37, November 2011.

Even though the TFETs have been mainly considered as an alternative for logic devices, analogue applications can also be envisioned which make use of the beneficial subthreshold swing of TFET devices that provides significant gain in regime of operation where the analog CMOS gain is poor. The much higher transconductance values particularly allow application of TFETs in high gain sensing devices, as e.g. shown in A. Gao, N. Lu, Y. Wang, and T. Li, "Robust ultrasensitive tunneling-FET biosensor for point-of-care diagnostics," Sci. Rep., vol. 6, no. November 2015, p. 22554, 2016 and R. Narang, K. V. S. Reddy, M. Saxena, R. S. Gupta, and M. Gupta, "A dielectric-modulated tunnel-FET-based biosensor for label-free detection: Analytical modeling study and sensitivity analysis," IEEE Trans. Electron Devices, vol. 59, no. 10, pp. 2809-2817, 2012.

Another technology that is currently used for sensing elementary down to cryogenic temperatures is Single Electron Transistor (SET), as known from M. Veldhorst et al., "An addressable quantum dot qubit with fault-tolerant control-fidelity", pages 981-985, nature nanotechnology, Dec. 10, 2014. The SET is currently the most used device for reading semiconductor quantum bits. However, it is known that SET has extremely low analog gain and its characteristics are extremely sensitive to the temperature. As shown in S. Mahapatra and A. M. Ionescu, "Hybrid CMOS single-electron-transistor device and circuit design", Jan. 9, 2006, Artech House, Inc,. it is also very difficult to engineer and is challenging to interface it with CMOS integrated circuits.

It is an object of the present invention to provide another solution for a charge sensing device for sensing changes in charge down to a single to few elementary charges and having a low temperature dependency.

SUMMARY OF THE INVENTION

This object has been achieved by the charge sensing device according to claim 1, the method for operating a charge sensing device, a read-out device and a method for fabrication as charge-sending device according to the further independent claims.

Further embodiments are indicated in the depending subclaims.

According to a first aspect, a charge sensing device for sensing charge variations in a charge storage area including:
a TFET having at least one sense gate;
a capacitive coupling for coupling the charge storage area with the sense gate.

According to a further aspect a method for operating the above charge sensing device may be provided, wherein a drain to source voltage is applied on the TFET, wherein a biasing voltage is applied on the biasing gate and wherein characteristics of an electrical quantity, in particular characteristics of a drain source current, are measured to detect a charge variation of the charge storage area.

According to a further aspect a read-out device is provided comprising:
a charge storage area, such as a quantum dot or an SET structure;
the above charge sensing device, so that a charge variation of the charge storage area causes an electrostatic potential of an intrinsic channel region to variate.

The above charge sensing device makes use of the superior characteristics of a Tunneling Field Effect Transistor (TFET). A TFET structure has a source region and a drain region which are doped of opposite type. A common TFET device structure may have a P-I-N (p-type, intrinsic, n-type) junction, in which the electrostatic potential of the intrinsic region is controlled by a gate terminal. The TFET is operated by applying gate bias so that electron accumulation occurs in the intrinsic region. At sufficient gate bias, band-to-band tunneling (BTBT) occurs when the conduction band of the intrinsic region aligns with the valence band of the P region. Electrons from the valence band of the p-type region tunnel into the conduction band of the intrinsic region and current can flow across the device. As the gate bias is reduced, the bands becomes misaligned and current can no longer flow.

A sensing device with a TFET has an advantageous sensing capability due to the much lower subthreshold swing as compared with conventional CMOS MOSFET devices. Therefore, TFETs can be used for high sensitivity charge sensing.

Sensing is performed by capacitively coupling a charge storage area to a tunneling junction of the TFET so that a variation of the charge in the charge storage area even in a range of one or few elementary charges has a detectable impact on the device characteristics such as the drain current.

Such a sensing device exploits a very high charge sensitivity so that they can be used as very sensitive charge sensors e.g. for the implementation of reading circuits for qubits in quantum dots, e.g. for quantum computing.

Qualitatively, the sensitivity of a semiconductor sensor can be defined as follows:

$$S \overset{def}{=} \frac{dI_D}{dQ} = \frac{dI_D}{dV}\frac{dV}{dQ}$$

As can be seen, the sensitivity is inversely related to the coupling capacitance, as $dV/dQ \sim C^{-1}$, and is device-independent. On the other hand, $dI_D/dV$ represents the change in the drain current with respect to an infinitesimal change of a gate potential caused by the injected charge. This latter term highly depends on the inherent properties of the device type as well as the device parameters, such as oxide thickness, channel thickness, geometry and the like.

A key observation of using TFET in a charge-sensing device is that the band-to-band-tunneling (BTBT) generation of TFETs is strongly correlated to the voltage drop across the tunneling junction via the source channel interface. Therefore, the steep slope switching property of TFETs can be used to sense changes in charge applied to the tunneling junction via the sense gate. This can be done by capacitively coupling a related charge storage area, such as a quantum dot, to the sense gate of the TFET. The capacitive coupling with a charge storage area, such as an SET-like structure or the like, may alter the effective gate potential of the sense gate of the TFET which can be sensed in a high resolution due to the steep switching slope of the TFET.

The use of TFETs for charge-sensing devices is beneficial as the switching slope of TFETs is not limited by the thermionic emission of carriers which allows to achieve higher sensitivity. Furthermore, the switching slope of the TFETs provide a low temperature dependency which is particularly important for sensing low charge variations in a range of single or few elementary charges.

Moreover, a measurement unit may be included which is configured to apply an electrical quantity, in particular a drain to source voltage, to the TFET and measure a resulting electrical characteristics, in particular a drain source current.

It may be provided that the TFET has a source region and a drain region which sandwich an intrinsic channel region, wherein the source region is an n+region and wherein the drain region is a p+region.

Particularly, a junction between the source region and the channel region may be formed as a heterojunction, particularly including silicon, IV and III-V semiconductors, and/or wherein the junction between the drain region and the channel region is formed as a homojunction, particularly including silicon.

According to an embodiment, the channel region of the TFET may be capacitively coupled with a sense gate and with a biasing gate, opposing each other with respect to the channel region.

Furthermore, the sense gate may be shorter than the biasing gate with respect to a length of the channel region between the source region and the drain region, wherein particularly the sense area is coupled to a junction between the source region and the channel region.

It may be provided that a/the measurement unit is configured to apply a biasing voltage to the biasing gate.

Regarding the method of operating the biasing voltage may be set to maximize the sensitivity of the charge sensing device.

According to a further aspect there is provided a use of a TFET in a charge sensing device for sensing a charge variation of a charge storage area, wherein the charge storage area is capacitively coupled with a sense gate of the TFET, so that a charge variation of the charge storage area causes an electrostatic potential of an intrinsic channel region to variate.

According to a further aspect the above charge sensing device is formed on a silicon-on-insulator substrate, wherein a source region is formed by an underetching and deposition process of a non-silicon semiconductor material.

It may be further provided that a sense gate and a biasing gate are formed wherein the sense gate is shorter than the biasing gate with respect to a length of the channel region between a source region and a drain region, wherein particularly the sense area is coupled to a junction between the source region and the channel region.

BRIEF DESCRIPTION OF THE DRAWINGS

Embodiments are described in more detail in conjunction with the accompanying drawings in which.

DETAILED DESCRIPTION OF EMBODIMENTS

Figure 1:
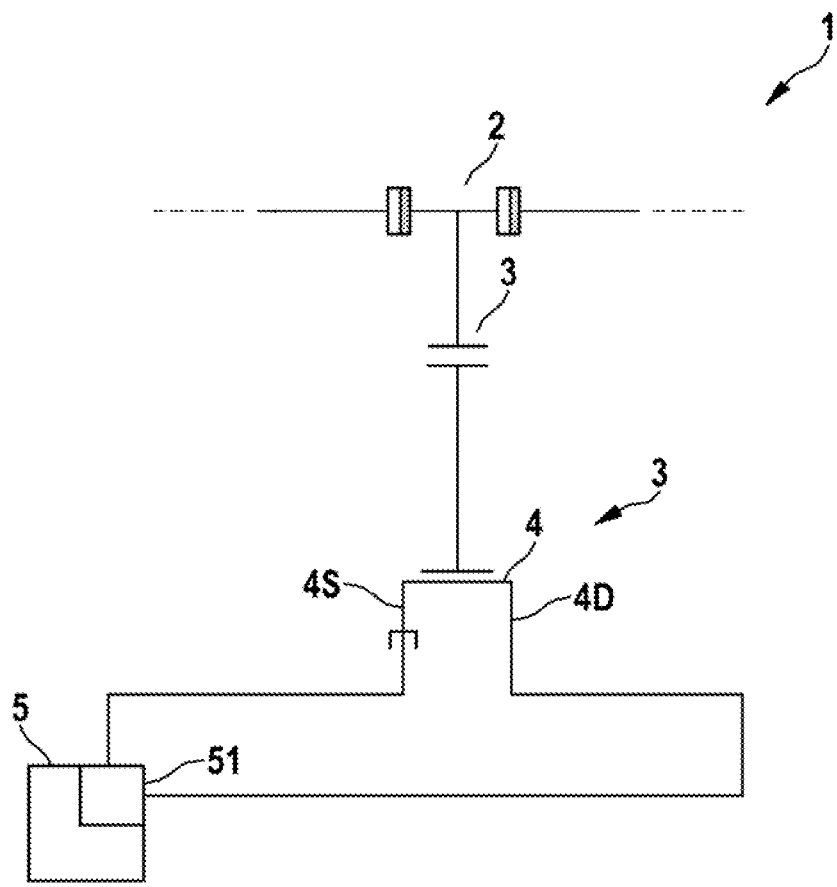
FIG. 1 shows a schematic diagram for illustrating a circuitry with a charge sensing device for sensing a change in charge in a charge storage area.

FIG. 1 schematically shows a read-out circuitry 1 for a charge storage with a charge storage area 2, which can e.g. be formed with an SET-like structure wherein the charge storage area 2 is capacitively coupled by means of the capacitive coupling element 3 with a sense gate of a TFET 4. The TFET 4 is part of a sensing device 3 according to the present invention. Furthermore, a measurement unit 5 is electrically connected with the TFET 4 to perform the reading out of an electrical quantity.

The TFET 4 further has a source terminal 4S and a drain terminal 4D above which a predetermined drain to source voltage VDS is applied by the measurement unit 5. Moreover, the measurement unit 5 is configured to detect the current flow. Changes of the current flow through the TFET 4 represent a change in charge causing a potential change of the sense gate of the TFET 4.

Figures 2, 3:
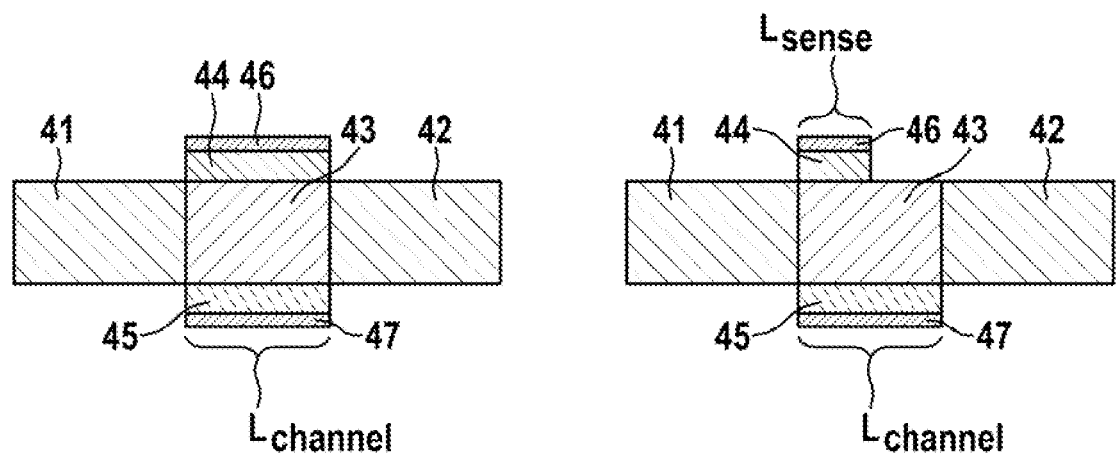
FIG. 2 schematically shows the structure of a charge-sensing device.
FIG. 3 schematically shows the structure of a further charge-sensing device with a high sensitivity.

In FIG. 2, the structure of the TFET which is included in the sensing device is illustrated. In general, a TFET has a similar structure as a metal-oxide-semiconductor field-effect transistor, whereas the fundamental switching mechanism differs. TFETs characteristic is governed by modulating quantum tunneling through a barrier instead of modulating thermionic emission over a barrier as in traditional MOSFETs. Because of this, TFETs are not limited by the thermal Maxwell-Boltzmann tail of carriers, which limits MOSFET drain current subthreshold swing to about 60 mV/decade of current at room temperature. The subthreshold swing is proportional to the transistor speed so that with lower subthreshold swing the operating frequency of the TFET can be increased.

A TFET generally has a P-I-N (p-type, intrinsic, n-type) junction structure, in which the electrostatic potential of an intrinsic channel region is controlled by a gate terminal. The TFET 4 has an n+source region 41 which may be formed of Ge and a p+drain region 42 between which an intrinsic channel region 43 is formed. On opposite sides across the channel region 43, a sense gate oxide 44 and a biasing gate oxide 45 are provided which separate a sense gate electrode 46 and a biasing gate electrode 47 from the channel region 43, respectively. Both gates 46, 47 are used to control the electrostatic potential of the intrinsic channel region 43.

The TFET 4 is operated by applying a gate potential so that electron accumulation occurs in the intrinsic channel region 43. At sufficient gate potential, band-to-band tunneling (BTBT) occurs when the conduction band of the intrinsic channel region 43 aligns with the valence band of the P region. Electrons from the valence band of the p-type drain region tunnel into the conduction band of the intrinsic channel region 43 and current can flow across a drain-source path. As the gate bias is reduced, the bands become misaligned and current can no longer flow.

As very little charges, in a range of single or few elementary charges, shall be detected gates are separated in sense gate 44, 46 and biasing gate 45, 47. The biasing gate 45, 47 is controlled by the measurement unit 5 and a sufficient biasing gate potential (biasing voltage) is applied to ensure BTBT. So, the control of the biasing gate 45, 47 is used to bias the TFET 4 to provide the best sensitivity.

The shown TFET 4 may have following device characteristics, such as channel thickness 10 nm, biasing gate oxide thickness 2.5 nm, a sense guide oxide thickness 2.5 nm, device width 10 nm, source/drain doping $10^{20}$ cm$^{-3}$, channel length 50 nm.

FIG. 3 shows a preferred embodiment which differs from the embodiment of FIG. 2 in that the configuration of the sense gate 44, 46 is made smaller. The sense gate oxide 44 is only present around the tunneling junction between the source region and the channel region 43 not covering the full length $L_{channel}$ of the channel region 43. In other words, the shortened sense gate extends from the junction with a reduced length over the channel region. For the above configuration the length $L_{sense}$ of the sense gate 44, 46 can be between 5 to 30 nm, preferably between 5% and 50% of the length $L_{channel}$ of the channel region. By means of the shortened sense gate 44, 46 the electrical field caused by the charged sense gate 44, 46 can thereby be focused toward the tunneling junction which allows increasing the sensitivity of the charge sensing device 3.

Figure 4A:
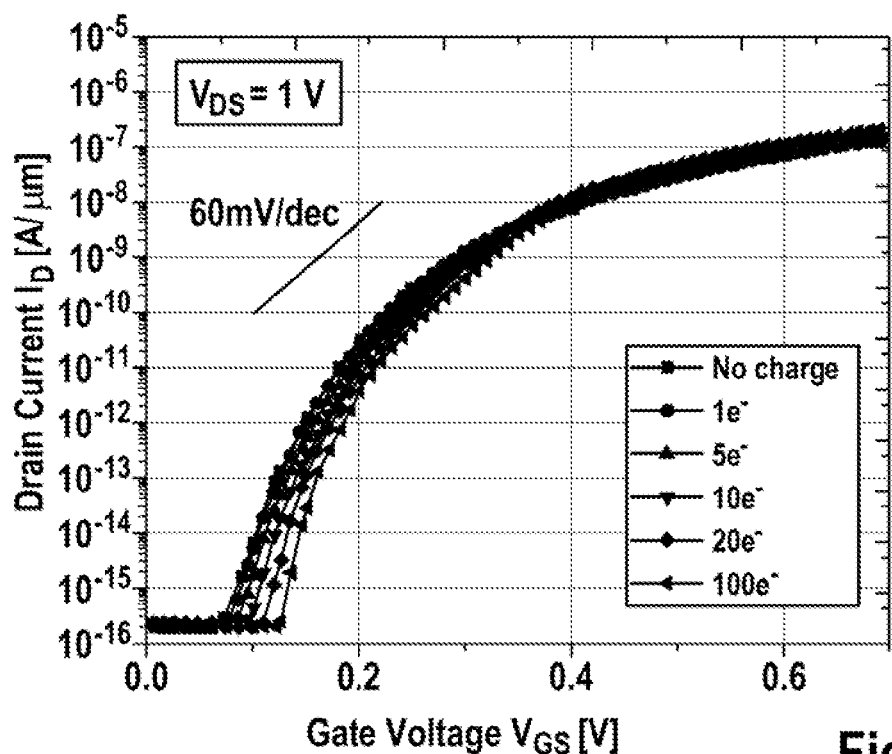
FIGS. 4a and 4b show diagrams for illustrating the characteristics of a drain current vs. a gate voltage and characteristics of the subthreshold swing vs. the drain current.
Figure 4B:
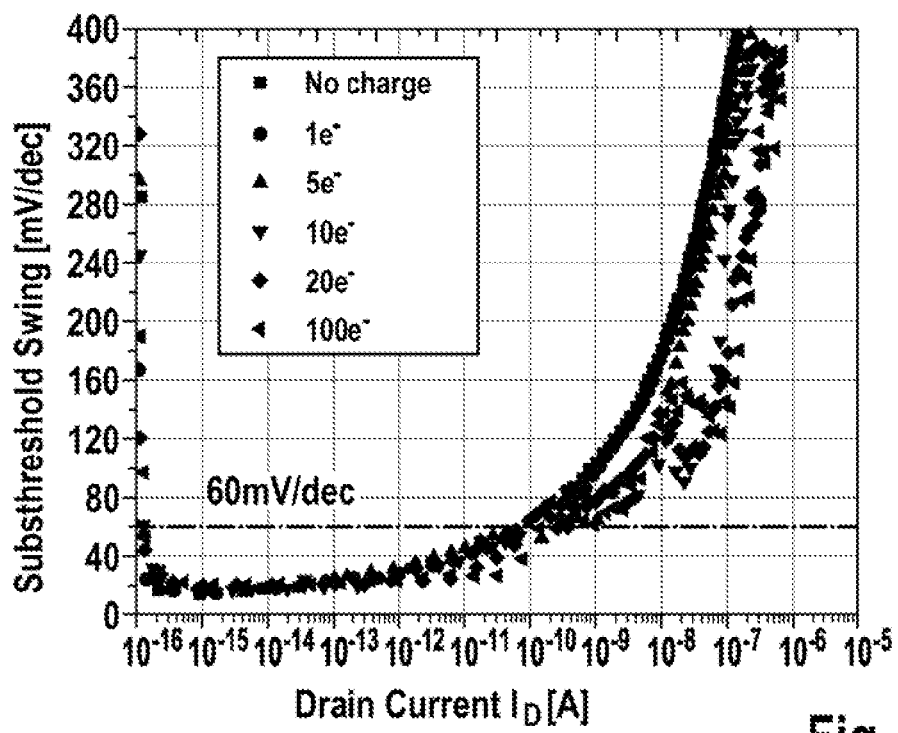

With respect to FIGS. 4a and 4b, it is shown a transfer characteristics for different injected charges into a sense gate 44, 46 while sweeping the biasing voltage VGs. It is observed a shift in proportion to the injected charges. For the exemplary TFET which is characterized by the diagrams of FIGS. 4 to 7, a subthermal subthreshold swing is up to about $I_D=10^{-11}$ A. Moreover, the subthreshold swing behavior remains the same for up to 20 electrons. For larger values, the floating gate voltage induced by the gate becomes large enough such that the voltage drop across the tunneling junction becomes pinned due to inversion layer formation beneath the sense gate 44, 46 screening the field effect of the tunneling region.

Figure 5A:
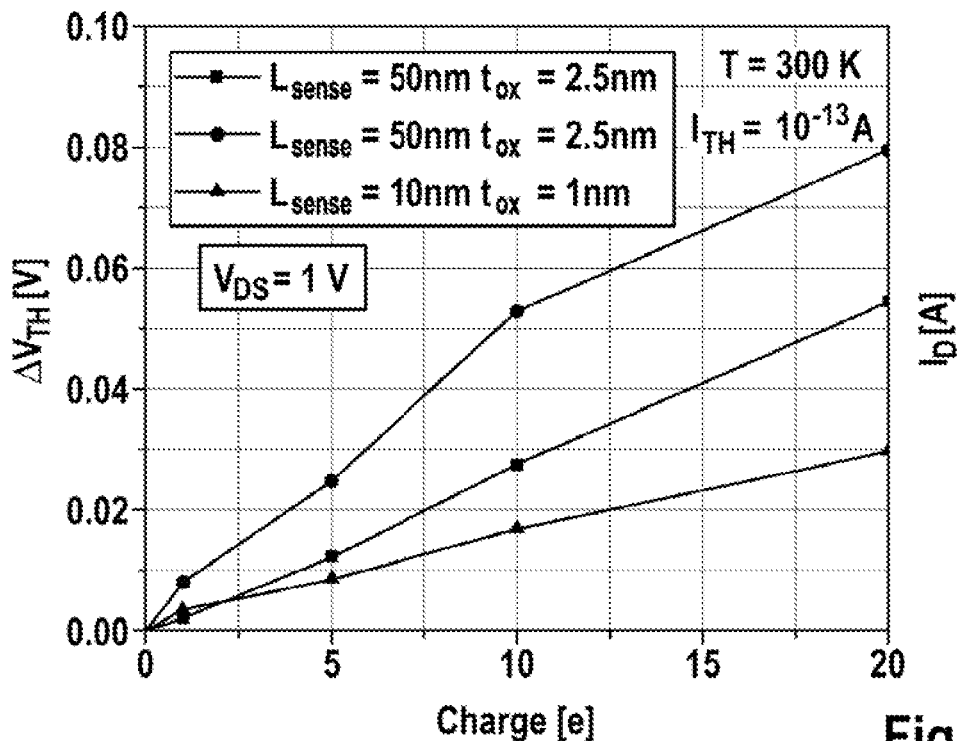
FIGS. 5a to 5b show diagrams for illustrating a threshold voltage shift for different injected charges in different TFET structures of the charge sensing device.
Figure 5B:
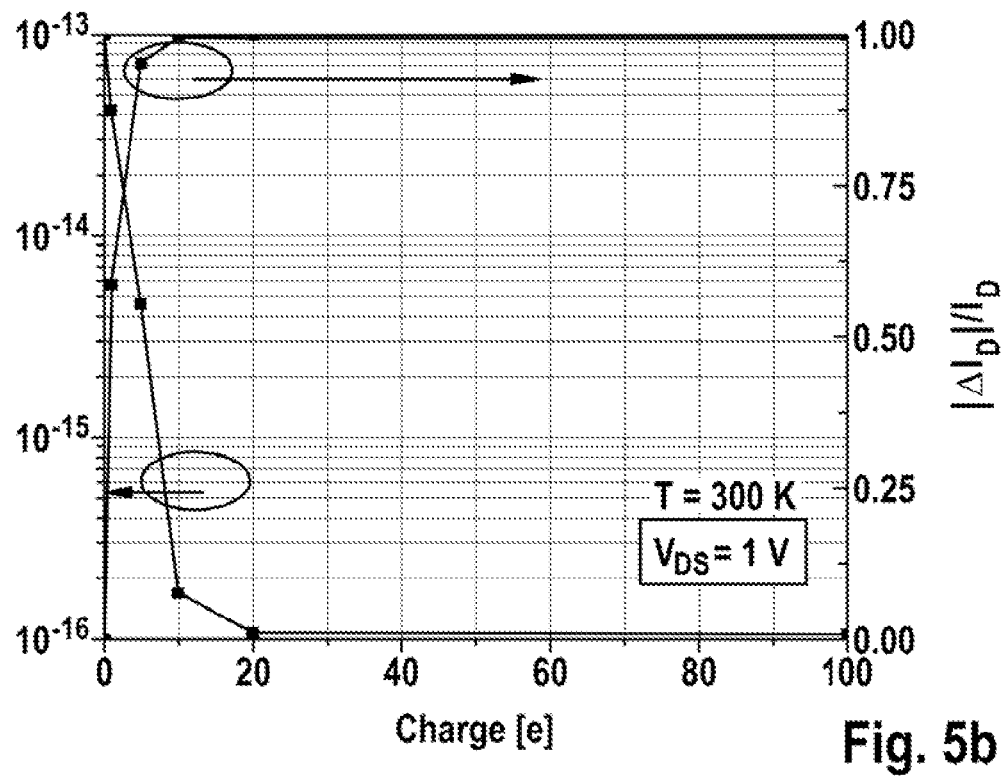

In FIG. 5a, the threshold voltage shift $\Delta V_{TH}$ induced by the injected charges into the sense gate 44, 46 is shown. The threshold voltage shift $\Delta V_{TH}$ is defined as gate voltage applied when $I_D=10^{-11}$ A. It can be seen that the embodiment as illustrated in FIG. 3 is more than twice time sensitive to charges than the TFET structure of FIG. 2. The reduced sense gate 44, 46 length ($L_{sense}$) further provides a smaller capacitance which increases the electric field underneath the sense gate 44, 46 and causing it to reach inversion formation for a smaller amount of charge. This reduces sensitivity when the number of electrons is increased above about 20 electrons as can be seen in the diagram of FIG. 5b.

Figure 6A:
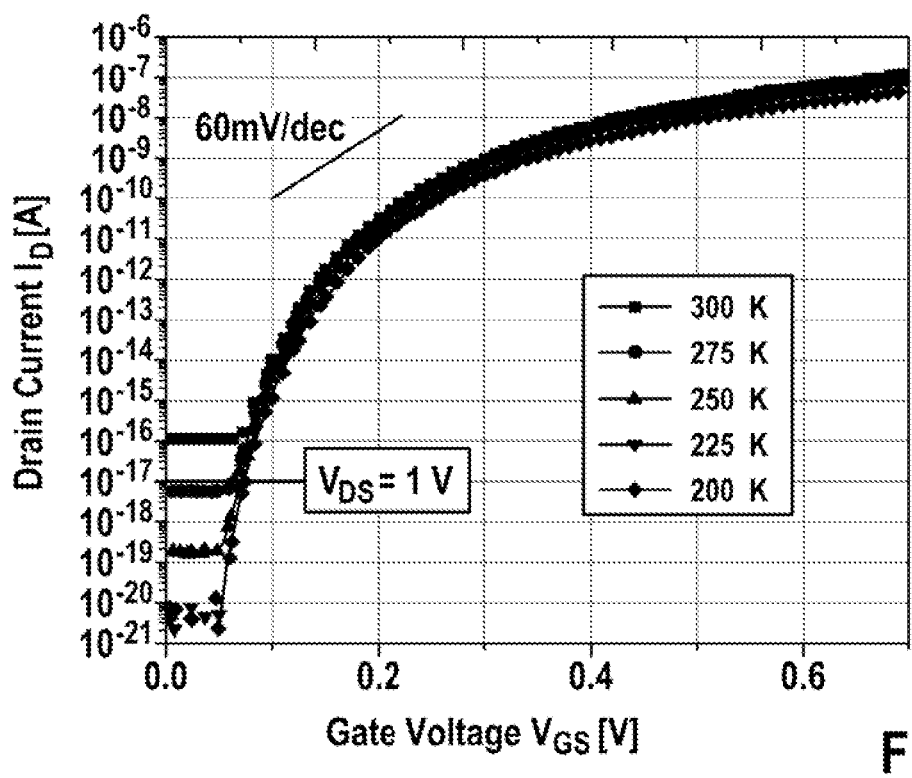
FIGS. 6a to 6c show diagrams for illustrating transfer characteristics for the TFET for different temperatures.
Figure 6B:
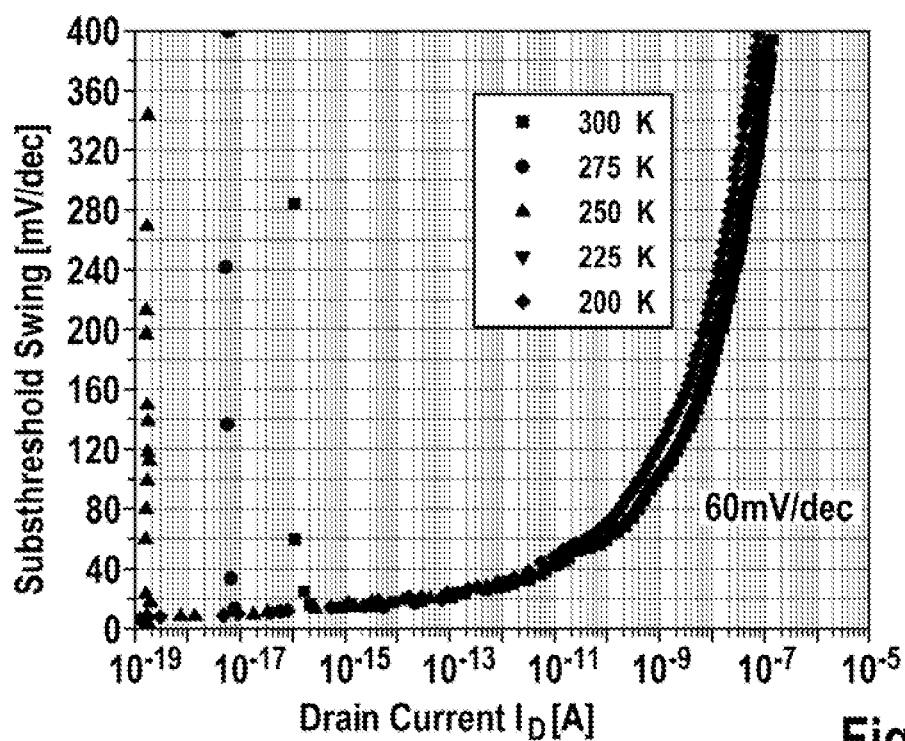
Figure 6C:
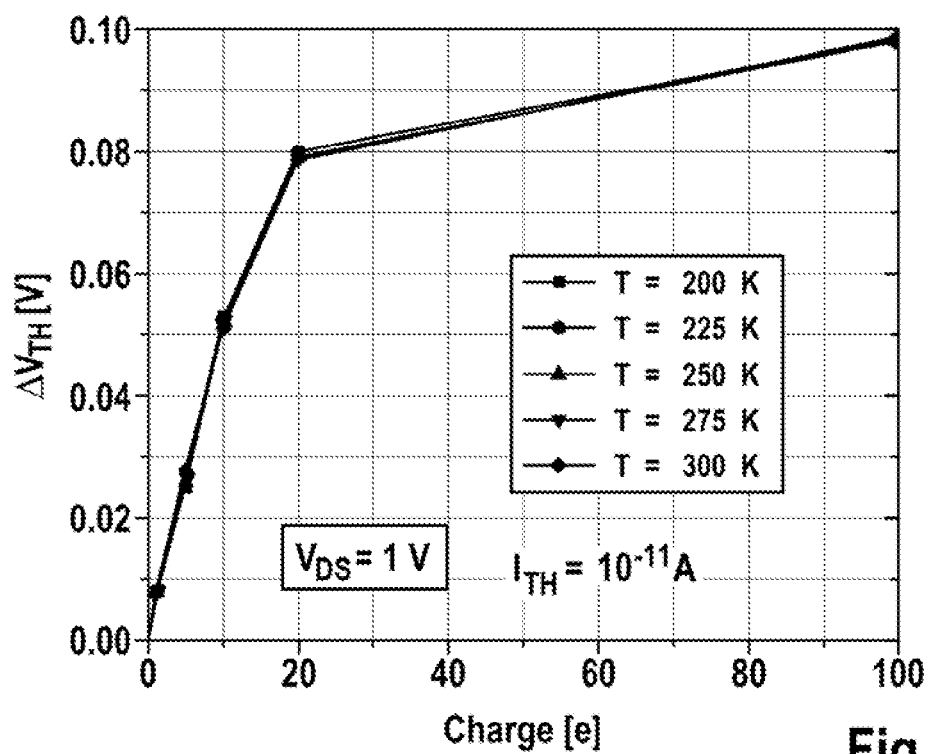

FIGS. 6a, 6b and 6c show the above diagrams in terms of the temperature dependency. It can be seen that one ideal property of TFETs is the relative insensitivity of the on-current and the subthreshold swing due to temperature variations. FIGS. 6a and 6b show the transfer characteristics of the TFET 4 for different temperatures which indicate an expected decrease of the SRH recombination (Shockley-Read-Hall recombination) current with decreasing temperature. FIG. 6c shows the threshold voltage shift $\Delta V_{TH}$ for different temperatures between 200 K and 300 K. It can be clearly seen the minimal difference between the shifts for the temperature.

FIGS. 7a to 7l briefly show the process steps for fabrication of the sensing device according to FIG. 3. In step of FIG. 7a, a silicon on insulator substrate 100 is provided. The silicon on insulator substrate 100 has a silicon layer 101 thereon to be processed further.

Figure 7A:
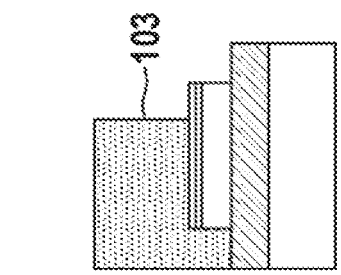
FIGS. 7a to 7l show steps of a process flow sketch for fabricating a TFET sensing device of the sensing device of FIG. 3.
Figure 7B:
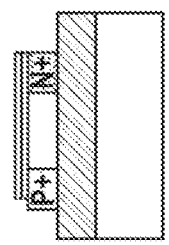

In step of FIG. 7b, on the surface of the silicon layer 101, a sacrificial oxide 102 is deposited which forms a mask for defining the area of the sensing device to be produced.

Figure 7C:
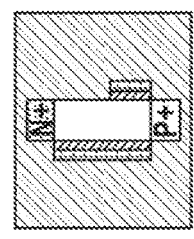

In step of FIG. 7c, by means of an anisotropic etching, the silicon layer 102 is removed in areas not covered by the sacrificial oxide 102 so that only a silicon area remains which defines the TFET structure of the sensing device to be produced.

Figure 7D:
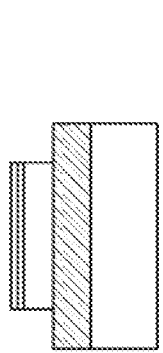

In step of FIG. 7d, an implant hard mask 103 is provided on a part of the TFET structure area which defines an area to form the drain region of the TFET.

Figure 7E:
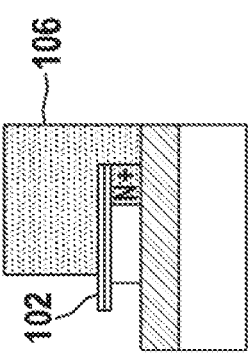

In step of FIG. 7e, by means of an implantation process, the drain region 105 is formed as an implant process, the implant hard mask 103 for defining the drain region 105 is removed.

Figure 7F:
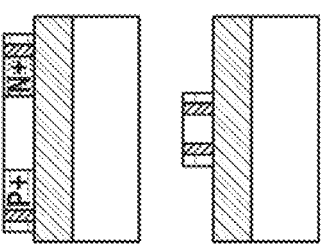

In step of FIG. 7f, a further implant hard mask 106 for defining the source region is deposited.

Figure 7G:
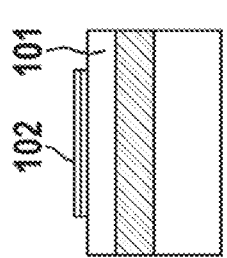

In step of FIG. 7g, under the remaining sacrificial oxide 102 an anisotropic etching of the silicon is performed so that a cavity 107 between the insulator of the substrate 100 and the sacrificial oxide 102 is formed.

Figure 7H:
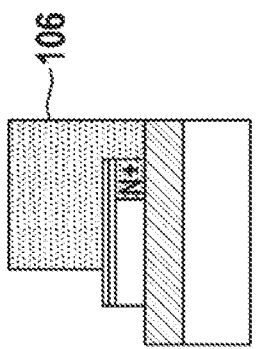

In step of FIG. 7h, the cavity 107 is filled with in situ doped Ge by means of an appropriate deposition or growth process.

Figure 7I:
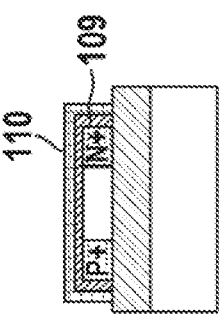

In step of FIG. 7i, the further implant hard mask for defining the source region is removed.

Figure 7J:
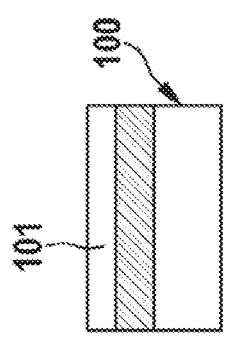

In step of FIG. 7j, the so formed structure is covered by a high K oxide 109 so that the surface and the side etches are covered by the high K oxide and thereafter a gate metal layer 110 is applied thereon.

Figure 7K:
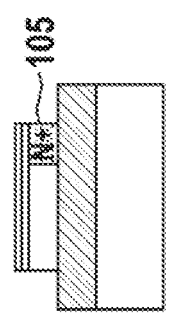

In step of FIG. 7k, the top layer of the structure is removed, and also the oxide and metal applied on the edges of the source and drain regions are removed by etching.

Figure 7L:
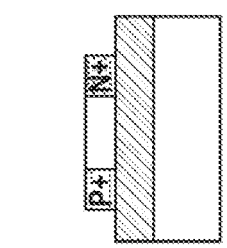

In step of FIG. 7l, a top-down view onto the sensing device is shown.

It remains the oxide and gate metal at the side edges of the remaining silicon layer which form opposing sense and biasing gate electrodes of the sensing device which are laterally arranged. By means of an appropriate masking, the sense gate electrode can be formed smaller and substantially arranged close to the source-channel junction to provide a better sensitivity as described with respect to FIG. 3.

The invention claimed is:
1. A charge sensing device for sensing charge variations in a charge storage area including:
   a TFET having at least one sense gate;
   a capacitive coupling for coupling the charge storage area with the sense gate,
wherein the channel region of the TFET is capacitively coupled with the sense gate and with a biasing gate separated therefrom, wherein the sense gate is shorter than the biasing gate with respect to a length of the channel region between the source region and the drain region.

2. The charge sensing device according to claim 1, wherein a measurement unit is included which is configured to apply an electrical quantity, in particular a drain to source voltage, to the TFET and measure resulting electrical characteristics, in particular a drain source current.

3. The charge sensing device according to claim 1, wherein the TFET has a source region and a drain region which sandwich an intrinsic channel region, wherein the source region is an n+ region and wherein the drain region is a p+ region.

4. The charge sensing device according to claim 3, wherein a junction between the source region and the channel region is formed as a heterojunction, particularly including silicon, IV and III-V semiconductors, and/or wherein the junction between the drain region and the channel region is formed as a homojunction, particularly including silicon.

5. The charge sensing device according to claim 1, wherein a measurement unit is configured to apply a predetermined biasing voltage to the biasing gate.

6. The charge sensing device according to claim 2, wherein the TFET has a source region and a drain region which sandwich an intrinsic channel region, wherein the source region is an n+ region and wherein the drain region is a p+ region.

7. The charge sensing device according to claim 6, wherein a junction between the source region and the channel region is formed as a heterojunction, particularly including silicon, IV and III-V semiconductors, and/or wherein the junction between the drain region and the channel region is formed as a homojunction, particularly including silicon.

8. The charge sensing device according to claim 7, wherein a/the measurement unit is configured to apply a predetermined biasing voltage to the biasing gate.

9. The charge sensing device according to claim 1, further comprising the charge storage area, such as a quantum dot or an SET structure, so that a charge variation of the charge storage area causes an electrostatic potential of an intrinsic channel region to variate.

* * * * *